United States Patent
Cheng

(10) Patent No.: US 8,492,767 B2
(45) Date of Patent: Jul. 23, 2013

(54) TFT SUBSTRATE AND MANUFACTURING METHOD THEREOF

(75) Inventor: Wen-da Cheng, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 13/377,542

(22) PCT Filed: Oct. 21, 2011

(86) PCT No.: PCT/CN2011/081118
§ 371 (c)(1),
(2), (4) Date: Dec. 10, 2011

(87) PCT Pub. No.: WO2013/033943
PCT Pub. Date: Mar. 14, 2013

(65) Prior Publication Data
US 2013/0056734 A1    Mar. 7, 2013

(30) Foreign Application Priority Data
Sep. 6, 2011  (CN) .......................... 2011 1 0261781

(51) Int. Cl.
*H01L 21/00*  (2006.01)

(52) U.S. Cl.
USPC .......... 257/59; 257/66; 257/72; 257/E21.411; 257/E29.294

(58) Field of Classification Search
USPC ....... 257/66, 72, E21.411, E29.294, E21.414, 257/E29.068
See application file for complete search history.

(56) References Cited

U.S. PATENT DOCUMENTS

| 6,025,012 | A  | * | 2/2000  | Matsuda et al. | 427/9 |
| 6,093,338 | A  | * | 7/2000  | Tani et al. | 252/62.9 R |
| 6,274,511 | B1 |   | 8/2001  | Wieczorek et al. | |
| 6,331,074 | B1 | * | 12/2001 | Kimura | 374/10 |
| 6,351,204 | B1 | * | 2/2002  | Yamasawa et al. | 336/200 |
| 2010/0270558 | A1 | * | 10/2010 | Ro et al. | 257/66 |
| 2011/0186853 | A1 | * | 8/2011  | Terai et al. | 257/72 |

FOREIGN PATENT DOCUMENTS

CN  101090123 A  12/2007

OTHER PUBLICATIONS

International Search Report of the PCT Application No. PCT/CN2011/081118.

* cited by examiner

*Primary Examiner* — N Drew Richards
*Assistant Examiner* — Ankush Singal

(57) ABSTRACT

A thin film transistor (TFT) substrate and a manufacturing method thereof are disclosed. The manufacturing method comprises: after a first metallic layer is formed on the TFT substrate, annealing the TFT substrate so that lattices of the first metallic layer are re-arranged to prevent occurrences of grain boundary defects in the first metallic layer. According to the present disclosure, after the first metallic layer is formed on the TFT substrate, the TFT substrate is annealed in sequence to re-arrange lattices of the first metallic layer. This effectively prevents occurrences of grain boundary defects and, consequently, metal protrusions in the first metallic layer.

16 Claims, 1 Drawing Sheet

TFT SUBSTRATE AND MANUFACTURING METHOD THEREOF

BACKGROUND

1. Technical Field

The present disclosure relates to the technical field of liquid crystal displaying, and more particularly, to a thin film transistor (TFT) substrate and a manufacturing method thereof.

2. Description of Related Art

Nowadays, liquid crystal displays (LCDs) have become much popularized because of their advantages such as high definition, small volume, low power consumption and little radiation. As the LCD technologies become increasingly sophisticated, LCDs have found wide application in various fields. Most of LCDs comprise a thin film transistor (TFT) substrate, a color filter (CF) substrate and a liquid crystal layer sandwiched therebetween. The TFT substrate comprises a substrate body and two metallic layers formed on the substrate, and other layers including an insulation layer are also formed between the two metallic layers.

The two metallic layers formed on the TFT substrate are usually formed through physical vapor deposition (PVD). However, a metallic layer formed in this way tends to have grain boundary defects, and during a subsequent high-temperature process of the TFT substrate, the metal in the metallic layer might protrude towards the grain boundary defects due to the increase in temperature to form metal protrusions. Such metal protrusions may even penetrate through the insulation layer to cause short-circuits between the two metallic layers when the TFT substrate is energized.

BRIEF SUMMARY

The primary objective of the present disclosure is to provide a TFT substrate and a manufacturing method thereof, which can prevent occurrences of grain boundary defects and, consequently, metal protrusions in a metallic layer of the TFT substrate.

The present disclosure provides a manufacturing method of a TFT substrate, which comprises:

after a first metallic layer is formed on the TFT substrate, annealing the TFT substrate so that lattices of the first metallic layer are re-arranged to prevent occurrences of grain boundary defects in the first metallic layer.

Preferably, the aforesaid method further comprises the following step before annealing the TFT substrate:

forming scan lines on the first metallic layer.

Preferably, the aforesaid method further comprises:

after an isolation layer and a second metallic layer are formed on the first metallic layer in sequence, annealing the TFT substrate so that lattices of the second metallic layer are re-arranged to prevent occurrences of grain boundary defects in the second metallic layer.

Preferably, the aforesaid method further comprises the following step before annealing the TFT substrate so that lattices of the second metallic layer are re-arranged:

forming data lines on the second metallic layer.

Preferably, annealing the TFT substrate comprises:

placing the TFT substrate in a temperature-rising environment and controlling a temperature of the temperature-rising environment to rise from 25° C. to 400° C.~600° C. at a uniform rate within 30~60 minutes;

keeping the temperature of 400° C.~600° C. for 40~60 minutes; and controlling the temperature of the temperature-rising environment to decrease to 25° C. at a uniform rate within 60~80 minutes.

Preferably, the temperature of the temperature-rising environment is controlled to rise from 25° C. to 400° C.~600° C. at a uniform rate within 45 minutes.

Preferably, the isolation layer comprises an insulation layer and a semiconductor layer, the insulation layer is disposed on the first metallic layer, and the semiconductor layer is disposed between the insulation layer and the second metallic layer.

The present disclosure further provides a TFT substrate formed with a first metallic layer. After the first metallic layer is formed on the TFT substrate, the TFT substrate is annealed to re-arrange lattices of the first metallic layer.

Preferably, the first metallic layer is formed with scan lines, and the annealing is carried out after the scan lines are formed on the first metallic layer.

Preferably, the TFT substrate further comprises:

an isolation layer and a second metallic layer formed on the first metallic layer in sequence. After the isolation layer and the second metallic layer are formed on the TFT substrate, the TFT substrate is annealed so that lattices of the second metallic layer are re-arranged.

Preferably, the second metallic layer is formed with data lines, and the annealing carried out after the second metallic layer is formed is carried out after the data lines are formed on the second metallic layer.

Preferably, the annealing process comprises:

placing the TFT substrate in a temperature-rising environment and controlling a temperature of the temperature-rising environment to rise from 25° C. to 400° C.~600° C. at a uniform rate within 30~60 minutes;

keeping the temperature of 400° C.~600° C. for 40~60 minutes; and controlling the temperature of the temperature-rising environment to decrease to 25° C. at a uniform rate within 60~80 minutes.

Preferably, in the annealing process, the temperature of the temperature-rising environment is controlled to rise from 25° C. to 400° C.~600° C. at a uniform rate within 45 minutes.

Preferably, the isolation layer comprises an insulation layer and a semiconductor layer, the insulation layer is disposed on the first metallic layer, and the semiconductor layer is disposed between the insulation layer and the second metallic layer.

According to the present disclosure, after the first metallic layer is formed on the TFT substrate, the TFT substrate is annealed in sequence to re-arrange lattices of the first metallic layer. This effectively prevents occurrences of grain boundary defects and, consequently, metal protrusions in the first metallic layer.

Figure 1:
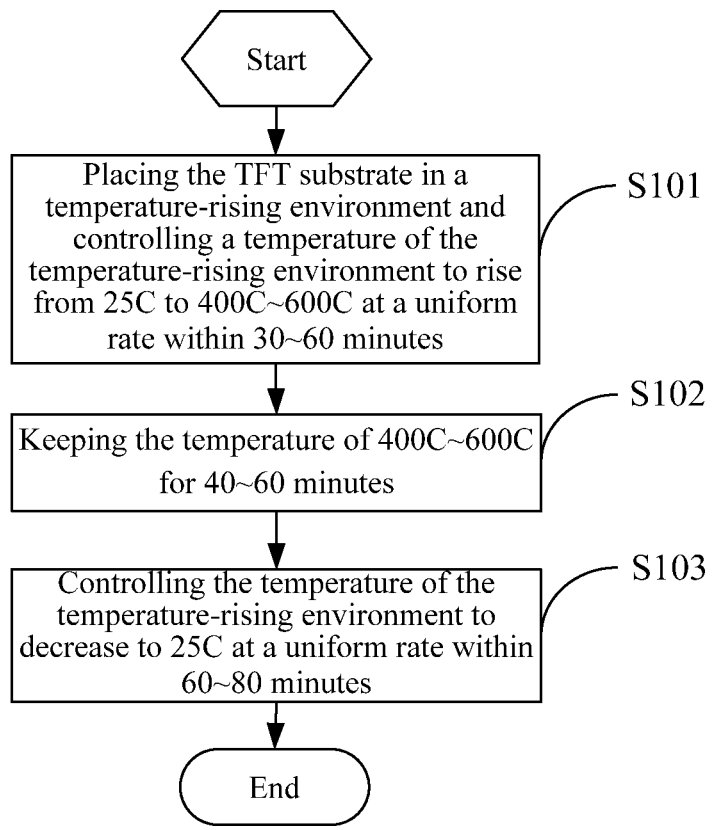
FIG. 1 is a flowchart diagram of a manufacturing method of a TFT substrate according to the present disclosure.

Hereinafter, implementations, functional features and advantages of the present disclosure will be further described with reference to embodiments thereof and the attached drawings.

DETAILED DESCRIPTION

It shall be understood that, the embodiments described herein are only intended to illustrate but not to limit the present disclosure.

An embodiment of a manufacturing method of a TFT substrate according to the present disclosure is provided. The manufacturing method of a TFT substrate comprises: after a first metallic layer is formed on the TFT substrate, annealing the TFT substrate so that lattices of the first metallic layer are re-arranged to prevent occurrences of grain boundary defects in the first metallic layer.

Further, this embodiment of the manufacturing method of a TFT substrate also comprises the following step before annealing the TFT substrate: forming scan lines on the first metallic layer. The scan lines are formed by exposing and etching the first metallic layer.

In the present disclosure, the first metallic layer formed on the TFT substrate is usually formed through physical vapor deposition (PVD). However, the first metallic layer formed in this way tends to have grain boundary defects; and during a subsequent high-temperature process or use in a high-temperature environment, the metal is prone to be extruded from a position where the grain boundary defects exist due to a too high temperature. In particular in the section of the first metallic layer on which the scan lines are formed, bulges (i.e., protrusions) tend to occur. In this embodiment, after the first metallic layer is formed, the TFT substrate is annealed to re-arrange lattices of the first metallic layer. After the lattices are re-arranged, the grain boundary defects in the first metallic layer can be significantly reduced so as to prevent or reduce occurrences of protrusions in the section of the first metallic layer on which the scan lines are formed.

Additionally, in this embodiment, after the TFT substrate is annealed, the lattices of the first metallic layer may further be detected. If no grain boundary defect exists, then the TFT substrate enters into a next process directly; otherwise, if the grain boundary defects exist, then the grain boundary defects are repaired before the TFT substrate enters into a next process.

Further, this embodiment of the manufacturing method of a TFT substrate also comprises: after an isolation layer and a second metallic layer are formed on the first metallic layer in sequence, annealing the TFT substrate so that lattices of the second metallic layer are re-arranged to prevent occurrences of grain boundary defects in the second metallic layer.

Further, this embodiment of the manufacturing method of a TFT substrate also comprises the following step before annealing the TFT substrate so that lattices of the second metallic layer are re-arranged: forming data lines on the second metallic layer. The data lines are formed by exposing and etching the second metallic layer.

In this embodiment, after the second metallic layer is formed, the TFT substrate is annealed to re-arrange lattices of the second metallic layer. After the lattices are re-arranged, the grain boundary defects in the second metallic layer can be significantly reduced so as to improve the quality of the lattices in the section of the second metallic layer on which the data lines are formed.

Additionally, in this embodiment, after the TFT substrate is annealed subsequent to formation of the second metallic layer, the lattices of the second metallic layer may further be detected. If no grain boundary defect exists, then the TFT substrate enters into a next process directly; otherwise, if the grain boundary defects exist, then the grain boundary defects are repaired before the TFT substrate enters into a next process.

Referring further to FIG. 1, there is shown a flowchart diagram of the embodiment of the manufacturing method of a TFT substrate according to the present disclosure. In this embodiment of the manufacturing method of a TFT substrate, annealing the TFT substrate comprises:

step S101: placing the TFT substrate in a temperature-rising environment and controlling a temperature of the temperature-rising environment to rise from 25° C. to 400° C.~600° C. at a uniform rate within 30~60 minutes;

step S102: keeping the temperature of 400° C.~600° C. for 40~60 minutes; and step S103: controlling the temperature of the temperature-rising environment to decrease to 25° C. at a uniform rate within 60~80 minutes.

Further, in the manufacturing method of a TFT substrate, the temperature of the temperature-rising environment is controlled to rise from 25° C. to 400° C.~600° C. at a uniform rate within 45 minutes.

In this embodiment, in the annealing process, the higher the temperature rises to be, the better the effect of re-arranging the lattices of the metallic layers will be.

Further, in this embodiment of the manufacturing method of a TFT substrate, the isolation layer comprises an insulation layer and a semiconductor layer; the insulation layer is disposed on the first metallic layer; and the semiconductor layer is disposed between the insulation layer and the second metallic layer.

In this embodiment, because the TFT substrate is annealed both after the first metallic layer is formed and after the second metallic layer is formed, the grain boundary defects are prevented in both the first metallic layer and the second metallic layer. This effectively prevents the phenomenon that, due to the grain boundary defects, the metal is extruded from a position where the grain boundary defects exist in the section of the first metallic layer on which the scan lines are formed and then passes through the isolation layer to connect with the second metallic layer. Thereby, short-circuits between the first metallic layer and the second metallic layer are effectively prevented when the TFT substrate is energized.

Figure 2:
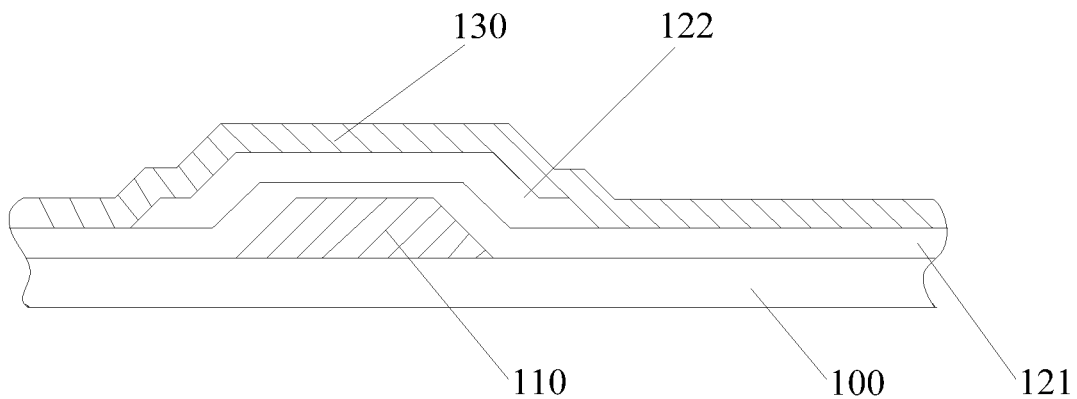
FIG. 2 is a schematic view of a structure of a TFT substrate according to the present disclosure.

Referring to FIG. 2, there is shown a schematic view of a structure of a TFT substrate 100 according to the present disclosure. The TFT substrate 100 is formed with a first metallic layer 110. After the first metallic layer is formed on the TFT substrate, the TFT substrate is annealed to re-arrange lattices of the first metallic layer.

Further, in this embodiment of the TFT substrate, the first metallic layer is formed with scan lines, and the annealing is carried out after the scan lines are formed on the first metallic layer.

In the present disclosure, the first metallic layer 110 formed on the TFT substrate 100 is usually formed through PVD. However, the first metallic layer 110 formed in this way tends to have grain boundary defects; and during a subsequent high-temperature process or use in a high-temperature environment, the metal is prone to be extruded from a position where the grain boundary defects exist due to a too high temperature. In particular in the section of the first metallic layer 110 on which the scan lines are formed, bulges (i.e., protrusions) tend to occur. In this embodiment, after the first metallic layer 110 is formed, the TFT substrate 100 is annealed to re-arrange lattices of the first metallic layer 110. After the lattices are re-arranged, the grain boundary defects in the first metallic layer 110 can be significantly reduced so as to prevent or reduce occurrences of protrusions in the section of the first metallic layer 110 on which the scan lines are formed.

Additionally, in this embodiment, after the TFT substrate 100 is annealed, the lattices of the first metallic layer 110 may further be detected. If no grain boundary defect exists, then the TFT substrate 100 enters into a next process directly;

otherwise, if the grain boundary defects exist, then the grain boundary defects are repaired before the TFT substrate 100 enters into a next process.

Referring further to FIG. 2, this embodiment of the TFT substrate further comprises: an isolation layer and a second metallic layer 130 formed on the first metallic layer 110 in sequence. After the isolation layer and the second metallic layer 130 are formed on the TFT substrate 100, the TFT substrate 100 is annealed so that lattices of the second metallic layer 130 are re-arranged.

Further, in this embodiment of the TFT substrate 100, the second metallic layer 130 is formed with data lines; and the annealing carried out after the second metallic layer 130 is formed is carried out after the data lines are formed on the second metallic layer 130.

In this embodiment, after the second metallic layer 130 is formed, the TFT substrate 100 is annealed to re-arrange lattices of the second metallic layer 130. After the lattices are re-arranged, the grain boundary defects in the second metallic layer 130 can be significantly reduced so as to improve the quality of the lattices in the section of the second metallic layer 130 on which the data lines are formed.

Additionally, in this embodiment, after the TFT substrate 100 is annealed subsequent to formation of the second metallic layer 130, the lattices of the second metallic layer 130 may further be detected. If no grain boundary defect exists, then the TFT substrate 100 enters into a next process directly; otherwise, if the grain boundary defects exist, then the grain boundary defects are repaired before the TFT substrate 100 enters into a next process.

Further, in this embodiment of the TFT substrate 100, the annealing comprises: placing the TFT substrate 100 in a temperature-rising environment and controlling a temperature of the temperature-rising environment to rise from 25° C. to 400° C.~600° C. at a uniform rate within 30~60 minutes; keeping the temperature of 400° C.~600° C. for 40~60 minutes; and controlling the temperature of the temperature-rising environment to decrease to 25° C. at a uniform rate within 60~80 minutes.

Further, in this embodiment of the TFT substrate 100, the temperature of the temperature-rising environment is controlled to rise from 25° C. to 400° C.~600° C. at a uniform rate within 45 minutes in the annealing process.

Referring further to FIG. 2, in this embodiment of the TFT substrate 100, the isolation layer comprises an insulation layer 121 and a semiconductor layer 122; the insulation layer 121 is disposed on the first metallic layer 110; and the semiconductor layer 122 is disposed between the insulation layer 121 and the second metallic layer 130.

In this embodiment, because the TFT substrate 100 is annealed both after the first metallic layer 110 is formed and after the second metallic layer 130 is formed, the grain boundary defects are prevented in both the first metallic layer 110 and the second metallic layer 130. This effectively prevents the phenomenon that, due to the grain boundary defects, the metal is extruded from a position where the grain boundary defects occur in the section of the first metallic layer 110 on which the scan lines are formed and then passes through the isolation layer to connect the first metallic layer 110 with the second metallic layer 130. Thereby, short-circuits between the first metallic layer 110 and the second metallic layer 130 are effectively prevented when the TFT substrate 100 is energized.

What described above are only preferred embodiments of the present disclosure but are not intended to limit the scope of the present disclosure. Accordingly, any equivalent structural or process flow modifications that are made on basis of the specification and the attached drawings or any direct or indirect applications in other technical fields shall also fall within the scope of the present disclosure.

What is claimed is:

1. A manufacturing method of a thin film transistor (TFT) substrate, comprising:
    after a first metallic layer is formed on the TFT substrate, annealing the TFT substrate so that lattices of the first metallic layer are re-arranged to prevent occurrences of lattice interface defects in the first metallic layer;
    wherein annealing the TFT substrate comprises:
    placing the TFT substrate in a temperature-rising environment and controlling a temperature of the temperature-rising environment to rise from 25° C. to 400° C.~600° C. at a uniform rate within 30~60 minutes;
    keeping the temperature of 400° C.~600° C. for 40~60 minutes; and
    controlling the temperature of the temperature-rising environment to decrease to 25° C. at a uniform rate within 60~80 minutes.

2. The manufacturing method of a TFT substrate of claim 1, further comprising the following step before annealing the TFT substrate: forming scan lines on the first metallic layer.

3. The manufacturing method of a TFT substrate of claim 1, wherein the temperature of the temperature-rising environment is controlled to rise from 25° C. to 400° C.~600° C. at a uniform rate within 45 minutes.

4. The manufacturing method of a TFT substrate of claim 1, further comprising:
    after an isolation layer and a second metallic layer are formed on the first metallic layer in sequence, annealing the TFT substrate so that lattices of the second metallic layer are re-arranged to prevent occurrences of grain boundary defects in the second metallic layer.

5. The manufacturing method of a TFT substrate of claim 4, further comprising the following step before annealing the TFT substrate so that lattices of the second metallic layer are re-arranged: forming data lines on the second metallic layer.

6. The manufacturing method of a TFT substrate of claim 4, wherein annealing the TFT substrate after the isolation layer and the second metallic layer are formed on the first metallic layer in sequence comprises:
    placing the TFT substrate in a temperature-rising environment and controlling a temperature of the temperature-rising environment to rise from 25° C. to 400° C.~600° C. at a uniform rate within 30~60 minutes;
    keeping the temperature of 400° C.~600° C. for 40~60 minutes; and
    controlling the temperature of the temperature-rising environment to decrease to 25° C. at a uniform rate within 60~80 minutes.

7. The manufacturing method of a TFT substrate of claim 4, wherein the isolation layer comprises an insulation layer and a semiconductor layer, the insulation layer is disposed on the first metallic layer, and the semiconductor layer is disposed between the insulation layer and the second metallic layer.

8. The manufacturing method of a TFT substrate of claim 6, wherein:
    in the annealing process after the isolation layer and the second metallic layer are formed on the first metallic layer in sequence, the temperature of the temperature-rising environment is controlled to rise from 25° C. to 400° C.~600° C. at a uniform rate within 45 minutes.

9. A TFT substrate formed with a first metallic layer, wherein after the first metallic layer is formed on the TFT substrate, the TFT substrate is annealed to re-arrange lattices of the first metallic layer; wherein the annealing process comprises:

placing the TFT substrate in a temperature-rising environment and controlling a temperature of the temperature-rising environment to rise from 25° C. to 400° C.~600° C. at a uniform rate within 30~60 minutes;

keeping the temperature of 400° C.~600° C. for 40~60 minutes; and controlling the temperature of the temperature-rising environment to decrease to 25° C. at a uniform rate within 60~80 minutes.

10. The TFT substrate of claim 9, wherein the first metallic layer is formed with scan lines, and the annealing is carried out after the scan lines are formed on the first metallic layer.

11. The TFT substrate of claim 9, wherein:
in the annealing process, the temperature of the temperature-rising environment is controlled to rise from 25° C. to 400° C.~600° C. at a uniform rate within 45 minutes.

12. The TFT substrate of claim 9, further comprising:
an isolation layer and a second metallic layer formed on the first metallic layer in sequence, wherein after the isolation layer and the second metallic layer are formed on the TFT substrate, the TFT substrate is annealed so that lattices of the second metallic layer are re-arranged.

13. The TFT substrate of claim 12, wherein the second metallic layer is formed with data lines, and the annealing carried out after the second metallic layer is formed is carried out after the data lines are formed on the second metallic layer.

14. The TFT substrate of claim 12, wherein the annealing carried out after the second metallic layer is formed comprises:

placing the TFT substrate in a temperature-rising environment and controlling a temperature of the temperature-rising environment to rise from 25° C. to 400° C.~600° C. at a uniform rate within 30~60 minutes;

keeping the temperature of 400° C-600° C. for 40-60 minutes; and controlling the temperature of the temperature-rising environment to decrease to 25° C. at a uniform rate within 60~80 minutes.

15. The TFT substrate of claim 12, wherein:
the isolation layer comprises an insulation layer and a semiconductor layer, the insulation layer is disposed on the first metallic layer, and the semiconductor layer is disposed between the insulation layer and the second metallic layer.

16. The TFT substrate of claim 14, wherein:
in the annealing process carried out after the second metallic layer is formed, the temperature of the temperature-rising environment is controlled to rise from 25° C. to 400° C.~600° C. at a uniform rate within 45 minutes.

* * * * *